(12) United States Patent
Liang et al.

(10) Patent No.: US 7,427,719 B2
(45) Date of Patent: Sep. 23, 2008

(54) SHIFTED SEGMENT LAYOUT FOR DIFFERENTIAL SIGNAL TRACES TO MITIGATE BUNDLE WEAVE EFFECT

(75) Inventors: Tao Liang, Westford, MA (US); Stephen H. Hall, Hillsboro, OR (US); Howard Heck, Hillsboro, OR (US); Gary A. Brist, Yamhill, OR (US); Bryce Horine, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 11/385,093

(22) Filed: Mar. 21, 2006

(65) Prior Publication Data

US 2007/0223205 A1 Sep. 27, 2007

(51) Int. Cl.
*H05K 1/03* (2006.01)
(52) U.S. Cl. ...................... 174/255; 174/260
(58) Field of Classification Search ............. 174/255, 174/260, 261; 361/392, 393, 394, 395
See application file for complete search history.

(56) References Cited

U.S. PATENT DOCUMENTS

| | | | | |
|---|---|---|---|---|
| 3,499,098 A | * | 3/1970 | McGahey | 174/261 |
| 4,103,102 A | * | 7/1978 | Klein | 174/254 |
| 5,844,783 A | * | 12/1998 | Kojima | 361/777 |
| 6,423,909 B1 | | 7/2002 | Haynie et al. | |
| 6,459,049 B1 | * | 10/2002 | Miller et al. | 174/261 |
| 7,020,960 B2 | * | 4/2006 | Nelson et al. | 29/846 |
| 2004/0181764 A1 | | 9/2004 | Brist et al. | |
| 2004/0262036 A1 | | 12/2004 | Brist et al. | |
| 2005/0034893 A1 | * | 2/2005 | McCall et al. | 174/255 |
| 2005/0208749 A1 | | 9/2005 | Beckman et al. | |

FOREIGN PATENT DOCUMENTS

| JP | 2004247615 A | 9/2004 |
|---|---|---|
| JP | 2005310885 A | 11/2005 |

OTHER PUBLICATIONS

"PCT International Search Report of the International Searching Authority", mailed Aug. 6, 2007, for PCT/US2007/064015, 3pgs.

* cited by examiner

*Primary Examiner*—Ishwar (I. B.) Patel
(74) *Attorney, Agent, or Firm*—Buckley, Maschoff & Talwalkar LLC

(57) ABSTRACT

An article of manufacture includes a circuit board and a pair of traces on or in the circuit board. The pair of traces includes a first trace and a second trace. The first trace includes a first segment and a second segment continuously joined to the first segment. The first segment coincides with a first longitudinal axis. The second trace includes a first segment that runs alongside the first segment of the first trace. The second trace also includes a second segment that runs alongside the second segment of the first trace. The second segment of the second trace is continuously joined to the first segment of the second trace. The second segment of the second trace coincides with the first longitudinal axis.

3 Claims, 4 Drawing Sheets

SHIFTED SEGMENT LAYOUT FOR DIFFERENTIAL SIGNAL TRACES TO MITIGATE BUNDLE WEAVE EFFECT

BACKGROUND

The core component of some conventional printed circuit boards (PCBs) is non-homogeneous. For example, the conventional FR4 material is formed of a weave of glass fiber bundles embedded in an epoxy resin. The non-homogeneity of the board material may have an adverse effect on signal propagation in a differential bus on the board, particularly in the case of data rates higher than about 1 Gb/s to 2 Gb/s. This adverse effect may be referred to as the "bundle weave effect".

The bundle weave effect is a result of the difference in dielectric constant between the glass fiber material and the epoxy resin. Typically, the direction of a pair of traces for a differential bus may be parallel to one of the weave directions. Consequently, in some cases, one of the traces may overlie a glass fiber bundle along the length of the trace, while the other trace may overlie epoxy resin along the length of the trace (and disregarding the cross bundles in the weave). The difference in dielectric constant between the two materials causes the respective signals in the two traces to propagate at different propagation velocities, leading to phase skew and reduction or elimination of the signal eye width (also known as the timing window). As a result the transmitted signal may not be properly received. The bundle weave effect increases linearly with the length of the bus, and also increases linearly with data rate. Thus, the bundle weave effect can be expected to become of increasing concern as data rates increase.

DETAILED DESCRIPTION

Figure 1:
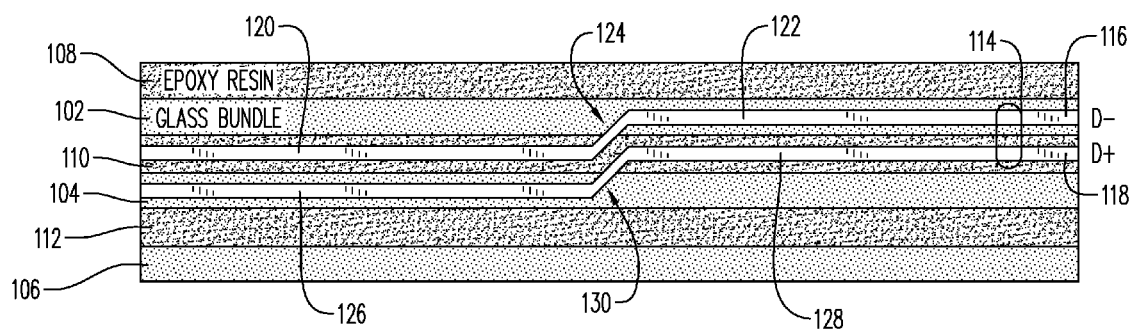
FIG. 1 is a schematic plan view of a differential bus trace layout according to some embodiments.

FIG. 1 is a schematic plan view of a differential bus trace layout according to some embodiments. In FIG. 1, the lightly shaded regions 102, 104, 106 correspond to regions on the surface of a PCB which overlie glass bundles (disregarding cross bundles in the weave structure, which are not indicated) and darkly shaded regions 108, 110, 112 correspond to regions on the surface of the PCB which overlie epoxy resin regions between the glass bundles (again disregarding cross bundles in the weave structure). Reference numeral 114 indicates a differential bus, formed of parallel traces 116, 118. (In accordance with conventional practices, the traces 116, 118 may be formed of copper.) The traces are shifted relative to each other, in a transverse direction, by a trace pitch distance that may be standard for a given trace geometry.

Trace 116 includes a first segment 120 and a second segment 122 that is continuously joined (at 124) to the first segment 120 and is shifted in the transverse direction by the pitch distance relative to the first segment 120. Segments 120 and 122 are substantially equal to each other in length.

Trace 118 includes a first segment 126 that runs alongside the segment 120 of trace 116, and a second segment 128 that runs alongside the segment 122 of trace 116. The segment 128 is continuously joined (at 130) to the segment 126. Segments 126 and 128 are substantially equal in length to each other and to segments 120, 122. Segment 128 is shifted relative to segment 126 in the same manner that segment 122 is shifted relative to segment 120, so that segment 128 of trace 118 is aligned with segment 120 of trace 116. As a result, the propagation velocity of the signal in segment 128 of trace 118 is substantially equal to the propagation velocity of the signal in segment 120 of trace 116. In other words, no more than one-half of traces 116, 118 exhibit a substantial difference in propagation velocity from each other. Thus, the bundle weave effect is reduced by at least half relative to a worst case in which all of one trace overlies an epoxy region (e.g., region 110) and all of the other trace overlies a glass bundle region (e.g., region 104).

(The illustrative example shown in FIG. 1 assumes, as is typically the case in PCB fabrication, that the weave directions are parallel to the edges of the board and the trace directions are also parallel to the edges of the board. It will be appreciated that the shape of the board is typically rectangular. The pitch between glass bundles may, but need not, be twice the trace pitch distance as illustrated in FIG. 1.)

Variations from the embodiment shown in FIG. 1 are possible. For example, the second segments of each trace may be shifted to the right, instead of being shifted to the left as shown in FIG. 1. Also, the number of segments in each trace may be increased to provide still a greater reduction in the maximum possible bundle weave effect that may be exhibited by the differential bus. For example, each trace may have four segments, as shown in the embodiment shown in FIG. 2.

Figure 2:
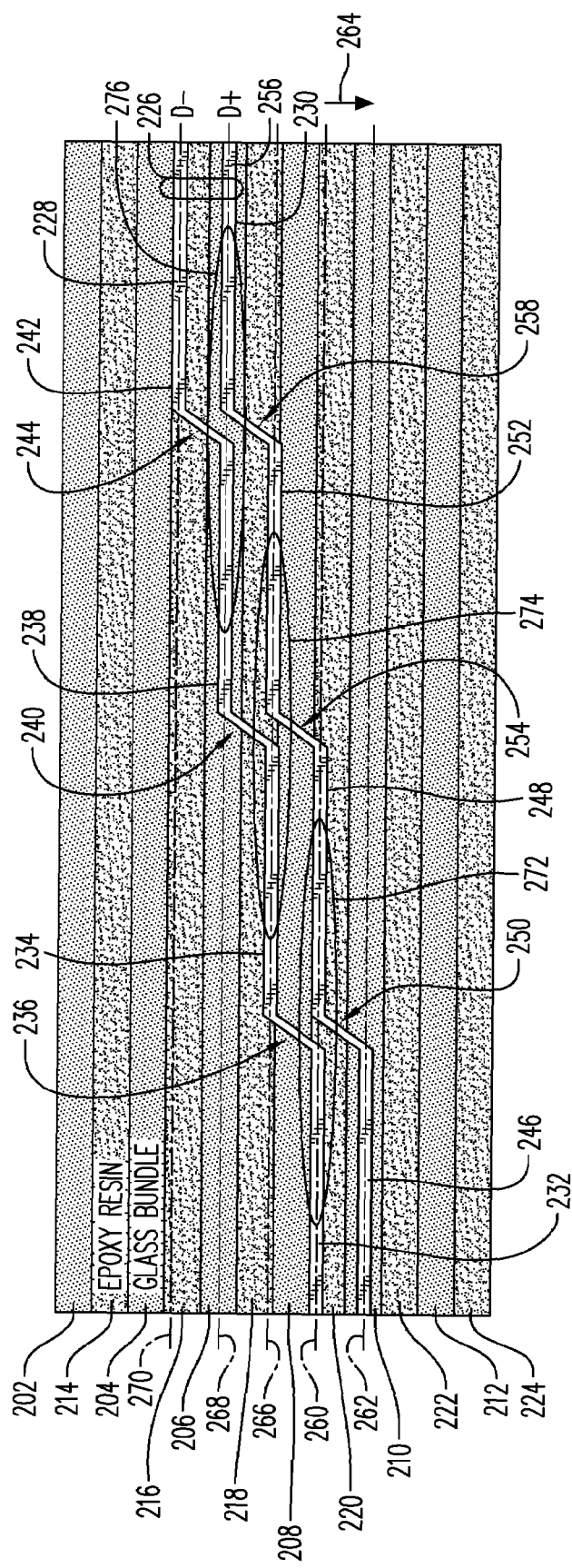
FIG. 2 is a schematic plan view of a differential bus trace layout according to some other embodiments.

Like FIG. 1, FIG. 2 is a schematic plan view of a differential bus trace layout. The lightly shaded regions 202, 204, 206, 208, 210, 212 correspond to regions on the surface of a PCB which overlie glass bundles (disregarding cross bundles in the weave structure, which are not indicated). Darkly shaded regions 214, 216, 218, 220, 222, 224 correspond to regions on the surface of the PCB which overlie epoxy resin regions between the glass bundles (again disregarding cross bundles in the weave structure).

Reference numeral 226 indicates a differential bus, formed of parallel traces 228, 230 which constitute a pair of traces.

As in the previous embodiment, the traces 228, 230 may be formed of copper, for example. Although the traces are indicated as being on the surface of the PCB, in alternative embodiments the traces may be part of a metallization layer inside the PCB. Thus the traces may be on or in the PCB.

Trace 228 includes a first segment 232 and a second segment 234 which is continuously joined (at 236) to the first segment 232. Trace 228 further includes a third segment 238 continuously joined (at 240) to segment 234, and a fourth segment 242 continuously joined (at 244) to segment 238.

Trace 230 includes a first segment 246 that runs alongside segment 232 of trace 228. Trace 230 also includes a second segment 248 that runs alongside segment 234 of trace 228. Segment 248 of trace 230 is continuously joined (at 250) to segment 246 of trace 230. Trace 230 further includes a third segment 252 that runs alongside segment 238 of trace 228. Segment 252 of trace 230 is continuously joined (at 254) to segment 248 of trace 230. In addition, trace 230 includes a fourth segment 256 that runs alongside segment 242 of trace 228. Segment 256 of trace 230 is continuously joined (at 258) to segment 252 of trace 230.

Segment 232 of trace 228 and segment 248 of trace 230 both coincide with a longitudinal axis 260 and consequently experience essentially the same underlying local board composition. Segment 246 coincides with a longitudinal axis 262 that is parallel to longitudinal axis 260. Longitudinal axis 262 is shifted from longitudinal axis 260 by the trace pitch distance and in the direction indicated by arrow mark 264. The direction indicated by arrow mark 264 is perpendicular to longitudinal axis 260.

Segment 234 of trace 228 and segment 252 of trace 230 both coincide with a longitudinal axis 266 and consequently experience essentially the same underlying local board composition. Longitudinal axis 266 is parallel to longitudinal axis 260 and is shifted from longitudinal axis 260 by the trace pitch distance and in the opposite direction from the direction indicated by arrow mark 264.

Segment 238 of trace 228 and segment 256 of trace 230 both coincide with a longitudinal axis 268 and consequently experience essentially the same underlying local board composition. Longitudinal axis 268 is parallel to longitudinal axis 266 and is shifted from longitudinal axis 266 by the trace pitch distance and in the opposite direction from the direction indicated by arrow mark 264.

Segment 242 of trace 228 coincides with a longitudinal axis 270 that is parallel to longitudinal axis 268. Longitudinal axis 270 is shifted from longitudinal axis 268 by the trace pitch distance and in the opposite direction from the direction indicated by arrow mark 264.

All of the segments 232, 234, 238, 242, 246, 248, 252 and 256 may be substantially parallel to each other and to one of the directions of the bundle weave structure. All of the segments 232, 234, 238, 242, 246, 248, 252 and 256 may be substantially equal to each other in length. All of the longitudinal axes 260, 262, 266, 268 and 270 may be parallel to an edge (not shown) of the PCB and all of the segments 232, 234, 238, 242, 248, 252 and 256 may be parallel to all of the longitudinal axes 260, 262, 266, 268 and 270 and to the edge of the PCB. In accordance with conventional practices, both weave directions of the bundle weave structure may be parallel to edges of the PCB. The PCB may be rectangular, in accordance with conventional practices.

It will be observed that the segment 232 of trace 228 is shifted from the segment 246 of trace 230 by the trace pitch distance in the direction opposite to the direction indicated by arrow mark 264. Both of the directions referred to in the previous sentence may be considered transverse directions relative to the longitudinal axes of the segments. Segment 234 of trace 228 is shifted from segment 232 of trace 228 by the trace pitch distance in the direction opposite to the direction indicated by arrow mark 264. Segment 234 is also shifted from segment 232 in the longitudinal direction of the segments by a distance slightly greater than the length of each segment. Segment 248 of trace 230 is shifted from segment 246 of trace 230 by the trace pitch distance in the direction opposite to the direction indicated by arrow mark 264. Segment 248 is also shifted from segment 246 in the longitudinal direction of the segments by a distance slightly greater than the length of each segment.

Segment 238 of trace 228 is shifted from segment 234 of trace 228 by the trace pitch distance in the direction opposite to the direction indicated by arrow mark 264. Segment 238 is also shifted from segment 234 in the longitudinal direction of the segments by a distance slightly greater than the length of each segment. Segment 252 of trace 230 is shifted from segment 232 of trace 228 by the trace pitch distance in the direction opposite to the direction indicated by arrow mark 264. Segment 252 is also shifted from segment 248 of trace 230 in the longitudinal direction of the segments by a distance slightly greater than the length of each segment.

Segment 242 of trace 228 is shifted from segment 238 of trace 228 by the trace pitch distance in the direction opposite to the direction indicated by arrow mark 264. Segment 242 is also shifted from segment 238 in the longitudinal direction of the segments by a distance slightly greater than the length of each segment. Segment 256 of trace 230 is shifted from segment 234 of trace 228 by the trace pitch distance in the direction opposite to the direction indicated by arrow mark 264. Segment 256 is also shifted from segment 252 of trace 230 in the longitudinal direction of the segments by a distance slightly greater than the length of each segment.

As indicated at 272, segment 248 of trace 230 is aligned with segment 232 of trace 228 so that the two segments are effectively paired with each other in terms of the underlying board composition experienced by the two segments. (As the term "aligned" is used herein and in the appended claims, two segments are "aligned" if their respective longitudinal axes coincide.) As indicated at 274, segment 252 of trace 230 is aligned with segment 234 of trace 228 so that the two segments are effectively paired with each other in terms of the underlying board composition experienced by the two segments. As indicated at 276, segment 256 of trace 230 is aligned with segment 238 of trace 228 so that the two segments are effectively paired with each other in terms of the underlying board composition experienced by the two segments. Consequently, in the worst case with this trace layout, all but a quarter of trace 228 "sees" essentially the same propagation velocity as all but a quarter of trace 230, so that the trace configuration shown in FIG. 2 reduces the bundle weave effect by at least three-fourths relative to a worst case in which both traces are straight and one trace overlies an epoxy region and the other overlies a glass bundle region. The trace layout technique shown herein is low in cost, and requires only a small increase in the board area required for layout of the differential bus. There is no need to match the trace pitch to the glass bundle pitch (which may not be known) or to a multiple of the glass bundle pitch, and except for the modest lateral shifts from one segment to the next, the trace direction may comply with conventional practices by paralleling the board edges, so that trace layout does not become significantly more complicated than in conventional trace layout techniques.

The number of segments in the differential bus may be two, three, four or any other larger number. For many purposes four segments (leading to reduction of worst case bundle weave effect by at least 75%) will be adequate. The number of segments to be formed may be decided upon based on the length of the bus, the data rate, and the desired level of mitigation of the bundle weave effect. Some guidance as to specific applications of this trace layout technique will now be provided by the following discussion.

As noted above, propagation velocity is a function of dielectric constant. In particular:

$$v = \frac{\sqrt{\varepsilon_{reff}}}{c_0}, \quad \text{(Eq. 1)}$$

where:
v is the propagation velocity;
$\epsilon_{reff}$ is the effective dielectric constant; and
$c_0$ is the speed of light.

An estimate of the timing noise $T_{noise}$ can be calculated as follows:

$$T_{noise} = \frac{(z/v_{D+} - z/v_{D-})}{UI} = \frac{\left(\sqrt{\epsilon_{reff\_D+}} - \sqrt{\epsilon_{reff\_D-}}\right) \cdot z}{c_0 \cdot UI}, \quad \text{(Eq. 2)}$$

where:
z is the length of the differential bus;
$v_{D+}$ is the propagation velocity in one of the traces;
$v_{D-}$ is the propagation velocity in the other one of the traces;
$\epsilon_{reff\_D+}$ is the effective dielectric constant seen by one of the traces;
$\epsilon_{reff\_D-}$ is the effective dielectric constant seen by the other one of the traces; and
UI, the unit interval, is the inverse of the data rate.

Using time domain reflectometry on microstrip test structures, a difference in effective dielectric constant between epoxy regions and glass bundle regions has been estimated at 0.23.

Figure 3:
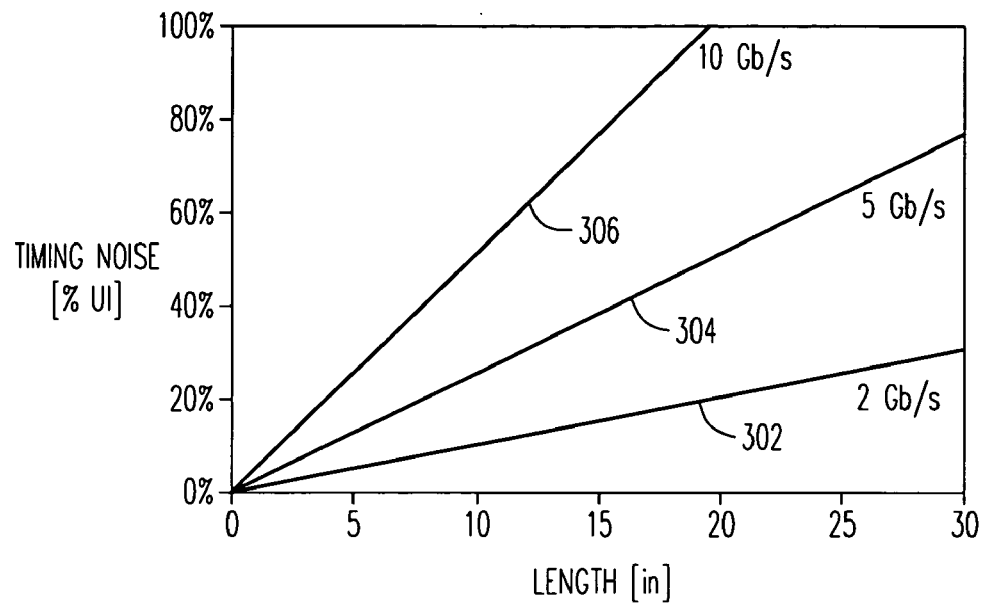
FIG. 3 is a graph that shows estimated worst case levels of bundle weave effect for various data rates and bus lengths when conventional straight trace layouts are employed.

FIG. 3 is a graph that shows estimated worst case levels of bundle weave effect for various data rates and bus lengths when conventional straight trace layouts are employed.

Graph line 302 in FIG. 3 shows the estimated worst case timing noise (as a percent of the UI) as a function of bus length when the data rate is 2 Gb/s. Graph line 304 shows the estimated worst case timing noise as a function of bus length when the data rate is 5 Gb/s. Graph line 306 shows the estimated worst case timing noise as a function of bus length when the data rate is 10 Gb/s.

Figure 4:
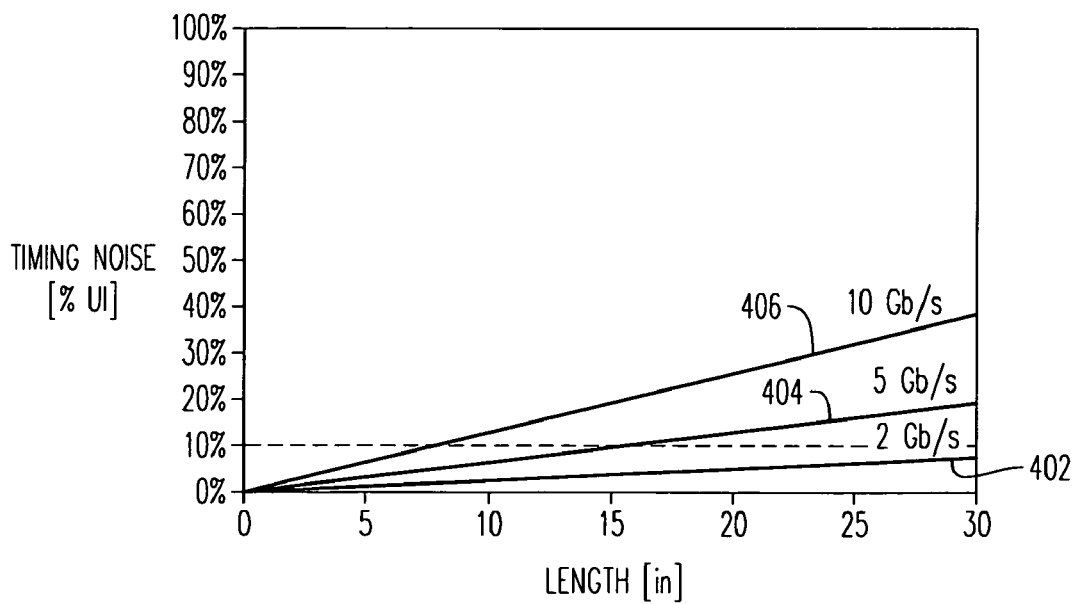
FIG. 4 is a graph that shows estimated worst case levels of bundle weave effect for various data rates and bus lengths when four-segment trace layouts are employed in accordance with the embodiment of FIG. 2.

FIG. 4 is a graph that shows estimated worst case levels of bundle weave effect for various data rates and bus lengths when four-segment trace layouts are employed in accordance with the embodiment of FIG. 2 (i.e., with the estimated worst case reduced by 75%).

Graph line 402 in FIG. 4 shows the estimated worst case timing noise as a function of bus length (for a four-segment trace layout) when the data rate is 2 Gb/s. Graph line 404 shows the estimated worst case timing noise as a function of bus length (for a four-segment trace layout) when the data rate is 5 Gb/s. Graph line 406 shows the estimated worst case timing noise as a function of bus length (for a four-segment trace layout) when the data rate is 10 Gb/s.

As seen from FIG. 4, if there were a requirement that the worst case timing noise be kept below 10% of the UI, then the four-segment layout would meet this requirement for bus lengths up to 8 inches given a 10 Gb/s data rate and would meet this requirement for bus lengths up to 16 inches given a 5 Gb/s data rate.

Figure 5:
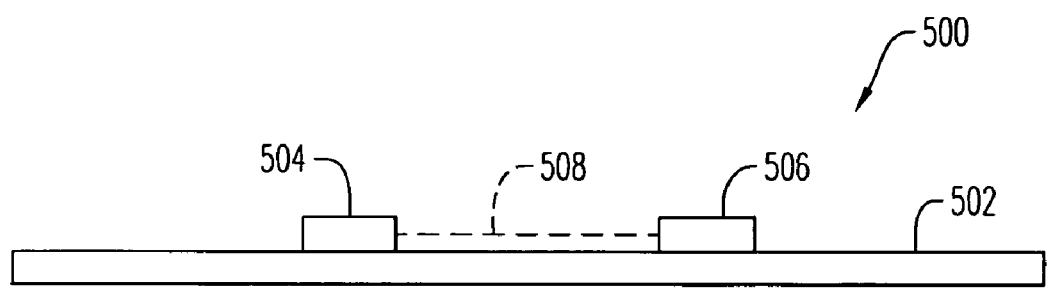
FIG. 5 is a schematic side view of a PCB according to some embodiments.
Figure 6:
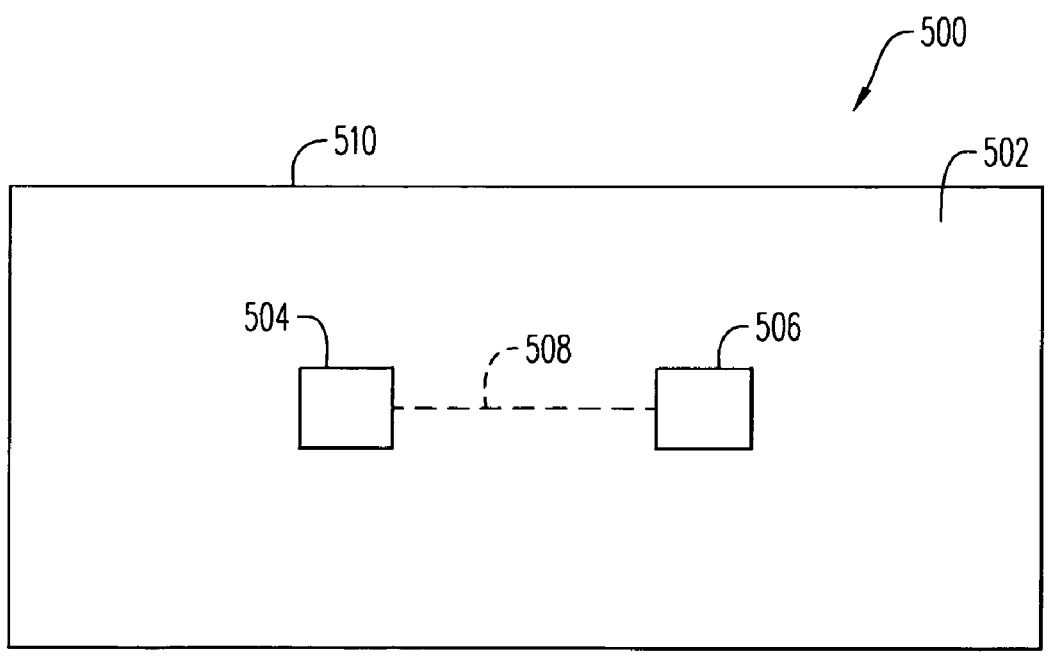
FIG. 6 is a schematic plan view of the PCB of FIG. 5.

FIG. 5 is a schematic side view of a PCB 500 according to some embodiments. FIG. 6 is a schematic plan view of the PCB.

The PCB 500 includes a board substrate 502, a first electronic device 504 mounted on the board substrate 502 and a second electronic device 506 mounted on the board substrate 502. (In common parlance, the term "PCB" refers both to a finished PCB including electronic devices, as well as to the board substrate as it exists before one or more devices or components are mounted thereon. In consonance with the common parlance, the term "circuit board" as used herein and in the appended claims refers both to the board substrate as well as to the PCB as a whole with some or all of the required electronic devices or components mounted thereon.) The electronic devices 504, 506 may each take the form of a packaged integrated circuit (or circuits) each mounted via a socket (not separately shown) or by another technique to the board substrate 502. For example, one of the devices may be a system CPU (microprocessor) and the other one of the devices may be a chipset, with the PCB being the motherboard of a desktop computer. Although only two electronic devices are shown, it should be understood that the number of electronic devices and other components mounted on the board substrate 502 may be greater than two.

Dashed line 508 in FIG. 5 schematically represents a differential signal bus that interconnects the electronic devices 504, 506. The differential bus 508 is constituted by a pair of signal traces laid out on or in the board substrate 502 in accordance, e.g., with the layouts shown in FIG. 1 or FIG. 2 or with a total number of segments per trace other than two or four. (It will be recognized that a trace layout having a total of four segments per trace can be said to include two segments per trace, as can any trace layout having a total of two or more segments per trace.) Reference numeral 510 in FIG. 6 indicates an edge of the board substrate 502. All of the segments of the traces (as seen, e.g., in FIGS. 1 and 2) of the differential bus 508 may be substantially parallel to edge 510 of board substrate 502. By the same token, the longitudinal axes shown in FIG. 2 may all be substantially parallel to edge 510. As is often the case with PCBs, the board substrate 502 may be primarily formed of FR4, incorporating a glass bundle weave structure as described above.

As the terms "coincide" or "coincides" are used herein and in the appended claims, a trace segment "coincides" with a longitudinal axis if both of the endpoints of the trace segment fall on the longitudinal axis, and two axes "coincide" with each other if every point on one axis falls on the other axis. An "axis" is a straight line. As used herein and in the appended claims, a "segment" is a portion of a trace that is shifted in a transverse direction relative to another portion of the trace.

Although all trace segments are equal in length in each illustrated embodiment, such need not be the case.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An article of manufacture comprising a circuit board and a pair of traces on or in the circuit board, the pair of traces including a first trace and a second trace, the first trace including a first segment and a second segment continuously joined to the first segment, the first segment coinciding with a first longitudinal axis, the second trace including a first segment that runs alongside the first segment of the first trace, the second trace also including a second segment that runs alongside the second segment of the first trace, the second segment of the second trace continuously joined to the first segment of the second trace, the second segment of the second trace coinciding with the first longitudinal axis, wherein the first and second segments of the first trace and the first and second segments of the second trace are all substantially equal to each other in length; and wherein the circuit board has glass fiber bundles embedded therein at a pitch that is twice a pitch distance between said first and second traces.

2. An article of manufacture comprising a circuit board and a pair of traces on or in the circuit board, the pair of traces including a first trace and a second trace, the first trace including a first segment and the second trace including a first segment that runs alongside the first segment of the first trace, the first segment of the first trace shifted from the first segment of the second trace by a trace pitch distance in a transverse direction perpendicular to a longitudinal direction of the first segment of the second trace, the first trace including a second segment that is continuously joined to the first segment of the first trace, the second segment shifted from the first segment of the first trace by the trace pitch distance in said transverse direction, the second trace including a second segment that runs alongside the second segment of the first trace, the second segment of the second trace continuously joined to the first segment of the second trace, the second segment of the second trace shifted from the first segment of the second trace by the trace pitch distance in said transverse direction;

wherein the first and second segments of the first trace and the first and second segments of the second trace are all substantially equal to each other in length; and wherein the circuit board has glass fiber bundles embedded therein at a pitch that is twice a pitch distance between said first and second traces.

3. An article of manufacture comprising a circuit board and a pair of traces on or in the circuit board, the pair of traces including a first trace and a second trace, the first trace including a first segment and a second segment continuously joined to the first segment, the second trace including a first segment that runs alongside the first segment of the first trace, the second trace also including a second segment that runs alongside the second segment of the first trace, the second segment of the second trace continuously joined to the first segment of the second trace, the second segment of the second trace aligned with the first segment of the first trace;

wherein the first and second segments of the first trace and the first and second segments of the second trace are all substantially equal to each other in length; and wherein the circuit board has glass fiber bundles embedded therein at a pitch that is twice a pitch distance between said first and second traces.

* * * * *